US011296021B2

(12) United States Patent
Lee

(10) Patent No.: US 11,296,021 B2
(45) Date of Patent: Apr. 5, 2022

(54) SEMICONDUCTOR MEMORY DEVICE AND MANUFACTURING METHOD THEREOF

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 14 days.

(21) Appl. No.: 16/848,262

(22) Filed: Apr. 14, 2020

(65) Prior Publication Data

US 2021/0098367 A1    Apr. 1, 2021

(30) Foreign Application Priority Data

Oct. 1, 2019   (KR) .................. 10-2019-0121697

(51) Int. Cl.
| | | |
|---|---|---|
| *H01L 27/11582* | (2017.01) | |
| *H01L 23/522* | (2006.01) | |
| *H01L 27/11573* | (2017.01) | |
| *H01L 23/528* | (2006.01) | |
| *H01L 27/11524* | (2017.01) | |
| *H01L 27/11529* | (2017.01) | |
| *H01L 27/11556* | (2017.01) | |
| *H01L 27/1157* | (2017.01) | |

(52) U.S. Cl.
CPC ...... *H01L 23/5226* (2013.01); *H01L 23/5283* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC ................................. H01L 27/11582
See application file for complete search history.

(56) References Cited

U.S. PATENT DOCUMENTS

2017/0256588 A1*  9/2017  Fukuda ............. H01L 27/11551
2019/0326316 A1* 10/2019  Son .................... H01L 27/11573

FOREIGN PATENT DOCUMENTS

| KR | 1020150139255 A | 12/2015 |
|---|---|---|
| KR | 1020160070896 A |  6/2016 |

* cited by examiner

*Primary Examiner* — Christopher A Johnson
(74) *Attorney, Agent, or Firm* — William Park & Associates Ltd.

(57) ABSTRACT

A semiconductor memory device, and a method of manufacturing a semiconductor memory device, includes a stacked structure including a plurality of conductive layers for local lines stacked on a semiconductor substrate defined by a cell region and a slimming region to be spaced apart from each other, wherein the plurality of conductive layers for local lines are stacked in a step structure in the slimming region. The semiconductor memory device also includes a plurality of contact plugs formed to penetrate the stack structure in the slimming region, the plurality of contact plugs corresponding to each of the conductive layers for local lines. Each of the plurality of contact plugs includes a protrusion part protruding horizontally, and the protrusion part is connected to a corresponding conductive layer for local lines among the plurality of conductive layers for local lines.

14 Claims, 16 Drawing Sheets

SEMICONDUCTOR MEMORY DEVICE AND MANUFACTURING METHOD THEREOF

CROSS-REFERENCE TO RELATED APPLICATION

The present application claims priority under 35 U.S.C. § 119(a) to Korean patent application number 10-2019-0121697 filed on Oct. 1, 2019, the entire disclosure of which is incorporated herein by reference.

BACKGROUND

1. Technical Field

The present disclosure generally relates to an electronic device, and more particularly, to a semiconductor memory device and a manufacturing method thereof.

2. Related Art

A semiconductor device, particularly, a semiconductor memory device, is generally classified as a volatile memory device or a nonvolatile memory device.

A nonvolatile memory device has relatively slow write and read speeds, but retains stored data even when a supply of power is interrupted. Thus, the nonvolatile memory device is used to store data to be retained regardless of whether power is supplied. Examples of volatile memory include Read Only Memory (ROM), Mask ROM (MROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM), and the like. The flash memory is classified as NOR type flash memory or NAND type flash memory.

Flash memory has advantages of both RAM, to and from which data is freely programmed and erased, and ROM, capable of preserving stored data even when the supply of power is interrupted. Flash memory has been widely used as storage media for portable electronic devices such as digital cameras, Personal Digital Assistant (PDAs), and MP3 players.

Flash memory devices may be classified as two-dimensional semiconductor memory devices, in which strings are horizontally formed on a semiconductor substrate, or three-dimensional semiconductor memory devices, in which strings are vertically formed on the semiconductor substrate.

A three-dimensional memory device is a memory device devised so as to overcome the limit of degree of integration in two-dimensional memory devices, and includes a plurality of channel plugs vertically formed on a semiconductor substrate. The channel plugs may include a drain select transistor, memory cells, and a source select transistor, which are connected in series between a bit line and a source line.

SUMMARY

In accordance with an embodiment of the present disclosure, a semiconductor memory device includes a stacked structure including a plurality of conductive layers for local lines stacked on a semiconductor substrate defined by a cell region and a slimming region to be spaced apart from each other, wherein the plurality of conductive layers for local lines are stacked in a step structure in the slimming region. The semiconductor memory device also includes a plurality of contact plugs formed to penetrate the stack structure in the slimming region, the plurality of contact plugs corresponding to each of the conductive layers for local lines. Each of the plurality of contact plugs includes a protrusion part protruding horizontally, and the protrusion part is connected to a corresponding conductive layer for local lines among the plurality of conductive layers for local lines.

In accordance with another embodiment of the present disclosure, a semiconductor memory device includes a peripheral circuit structure formed on a semiconductor substrate and a memory cell array formed above the peripheral circuit structure. The semiconductor memory device also includes a plurality of contact plugs penetrating a slimming region of the memory cell array, the plurality of contact plugs being connected to a plurality of metal lines of the peripheral circuit structure. The memory cell array includes a plurality of conductive layers for local lines, which are stacked in a step structure in the slimming region. Further, each of the plurality of contact plugs includes a protrusion part protruding horizontally, and the protrusion part is connected to a corresponding conductive layer for local lines among the plurality of conductive layers for local lines.

In accordance with still another embodiment of the present disclosure, a method of manufacturing a semiconductor memory device includes: forming a stack structure including a plurality of first material layers and a plurality of second material layers, which are alternately stacked in a cell region and a slimming region, wherein the first material layers and the second material layers are stacked in a step structure in which the second material layers are exposed in the slimming region; forming a sacrificial layer along an upper surface of the stack structure in the slimming region; and allowing the sacrificial layer to remain on only the upper surface of the stack structure by removing the sacrificial layer formed on a sidewall of the stack structure having the step structure. The method also includes: forming an interlayer insulating layer on the top of the entire structure, and forming a plurality of contact holes penetrating the interlayer insulating layer, the sacrificial layer, and the stack structure; forming an insulating layer for spacers on sidewalls of the second material layers exposed through sidewalls of the contact holes; removing the second material layers, and forming conductive layers for local word lines in spaces in which the second material layers are removed; removing the sacrificial layer exposed through the sidewalls of the contact holes; and forming contact plugs each having a protrusion part by filling, with a conductive material, the contact holes each including a space in which the sacrificial layer is removed.

BRIEF DESCRIPTION OF THE DRAWINGS

Example embodiments will now be described hereinafter with reference to the accompanying drawings; however, they may be embodied in different forms and should not be construed as being limited to the embodiments set forth herein. Rather, these embodiments are provided so that this disclosure will be enabling, and will convey the scope of the example embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Hereinafter, embodiments of the present disclosure will be described in detail with reference to the accompanying drawings in order for those skilled in the art to be able to readily implement the technical spirit of the present disclosure.

Some embodiments provide a semiconductor memory device capable of improving a process of connecting local lines of memory blocks included in the semiconductor memory device to peripheral circuits, and a manufacturing method of the semiconductor memory device.

Figure 1:
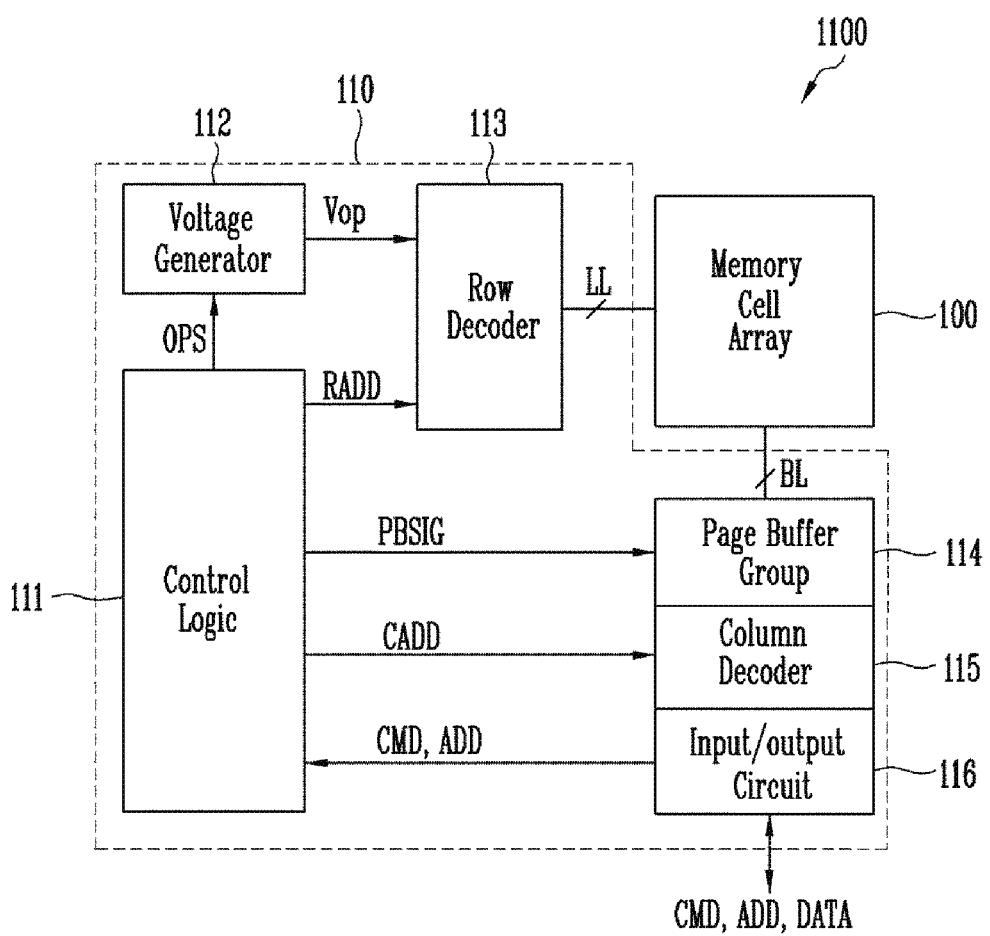
FIG. 1 is a diagram illustrating a semiconductor memory device in accordance with an embodiment of the present disclosure.

FIG. 1 is a diagram illustrating a semiconductor memory device 1100 in accordance with an embodiment of the present disclosure.

Referring to FIG. 1, the semiconductor memory device 1100 may include a memory cell array 100 capable of storing data and peripheral circuits 110 capable of performing a program, read, or erase operation of the memory cell array 100.

The memory cell array 100 may include a plurality of memory blocks including nonvolatile memory cells. Local lines LL may be connected to each of the memory blocks, and bit lines BL may be commonly connected to the memory blocks.

The peripheral circuits 110 may include control logic 111, a voltage generator 112, a row decoder 113, a page buffer group 114, a column decoder 115, and an input/output circuit 116.

The control logic 111 may control the voltage generator 112, the row decoder 113, the page buffer group 114, the column decoder 115, and the input/output circuit 116 according to a command CMD and an address ADD. For example, the control logic 111 may output an operation signal OPS and a page buffer control signal PBSIG in response to the command CMD, and output a row address RADD and a column address CADD in response to the address ADD. The control logic 111 may be implemented as hardware, software, or a combination of hardware and software. For example, the control logic 111 may be a control logic circuit operating in accordance with an algorithm and/or a processor executing control logic code.

The voltage generator 112 may generate and output operating voltages Vop necessary for a program, read, or erase operation in response to the operation signal OPS. For example, the voltage generator 112 may generate and output operating voltages Vop such as a program voltage, a read voltage, an erase voltage, and a pass voltage.

The row decoder 113 may transfer the operating voltages Vop to a selected memory block through the local lines LL in response to the row address RADD.

The page buffer group 114 may include a plurality of page buffers connected to the selected memory block through the bit lines BL. The page buffer group 114 may temporarily store data in a program or read operation in response to the page buffer control signal PBSIG.

The column decoder 115 may transmit data between the page buffer group 114 and the input/output circuit 116 in response to the column address CADD.

The input/output circuit 116 may receive a command CMD and an address ADD from an external device and transmit the command CMD and the address ADD to the control logic 111. The input/output circuit 116 may transmit data DATA received from the external device to the column address 115 in a program operation, and output data DATA received from the column address 115 to the external device in a read operation.

Figure 2:
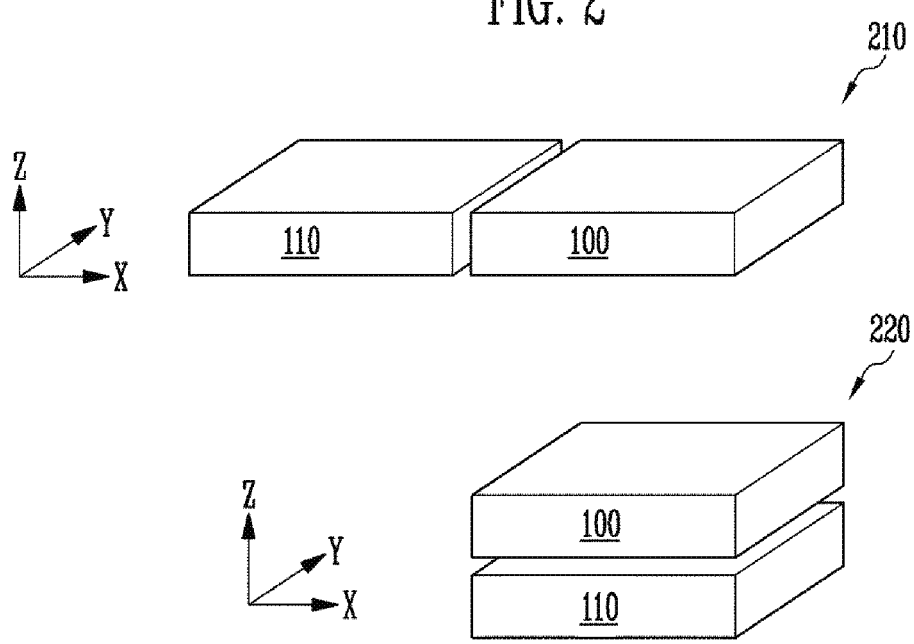
FIG. 2 is a view illustrating an arrangement between a memory cell array and peripheral circuits.

FIG. 2 is a view illustrating an arrangement between the memory cell array 100 and the peripheral circuits 110.

Referring to FIG. 2, the memory cell array 100 and the peripheral circuits 110, which are described in FIG. 1, may be variously arranged. For example, when a substrate is disposed in an X-Y direction, the memory cell array 100 and the peripheral circuits 110 may also be disposed in parallel to each other in the X-Y direction (210). Alternatively, the memory cell array 100 may be disposed above the peripheral circuits 110 in a direction (Z direction) vertical to the substrate (220). That is, the peripheral circuits 110 may be disposed between the substrate and the memory cell array 100.

Figure 3:
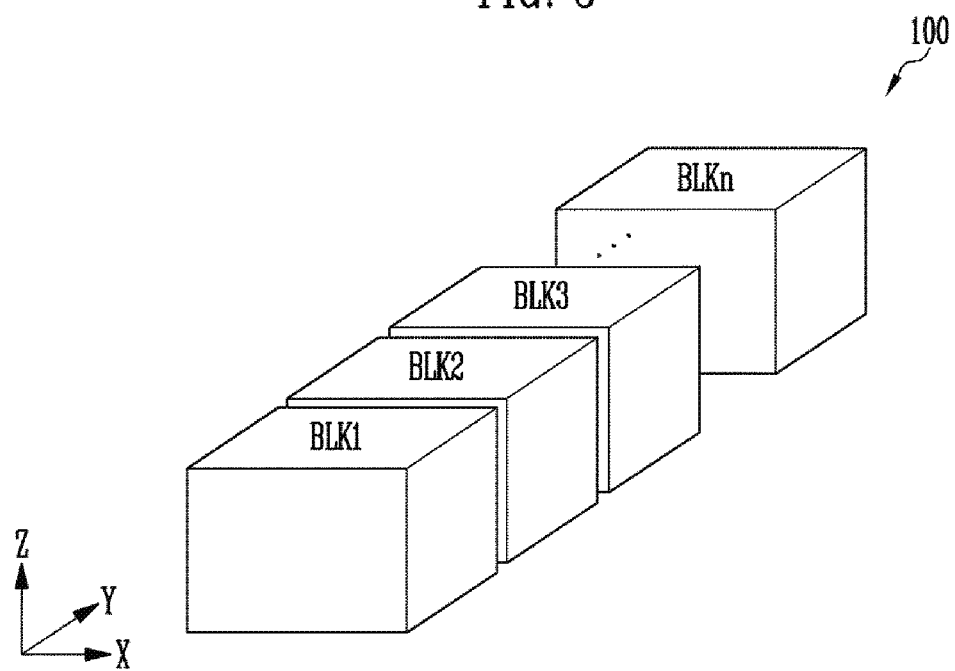
FIG. 3 is a view illustrating a memory cell array including memory blocks formed in a three-dimensional structure.

FIG. 3 is a view illustrating the memory cell array 100 including memory blocks BLK1 to BLKn formed in a three-dimensional structure.

Referring to FIG. 3, when the memory cell array 100 includes memory blocks BLK1 to BLKn formed in a three-dimensional structure, the memory blocks BLK1 to BLKn may be arranged in a Y direction. The Y direction may be a direction in which the bit lines BL shown in FIG. 1 extend.

Although a case where the memory cell array 100 includes one plane is illustrated in FIG. 3, the memory cell array 100 may include a plurality of planes. The plurality of planes may be arranged in an X direction, and memory blocks included in each plane may be arranged in the Y direction in the corresponding plane.

Figure 4:
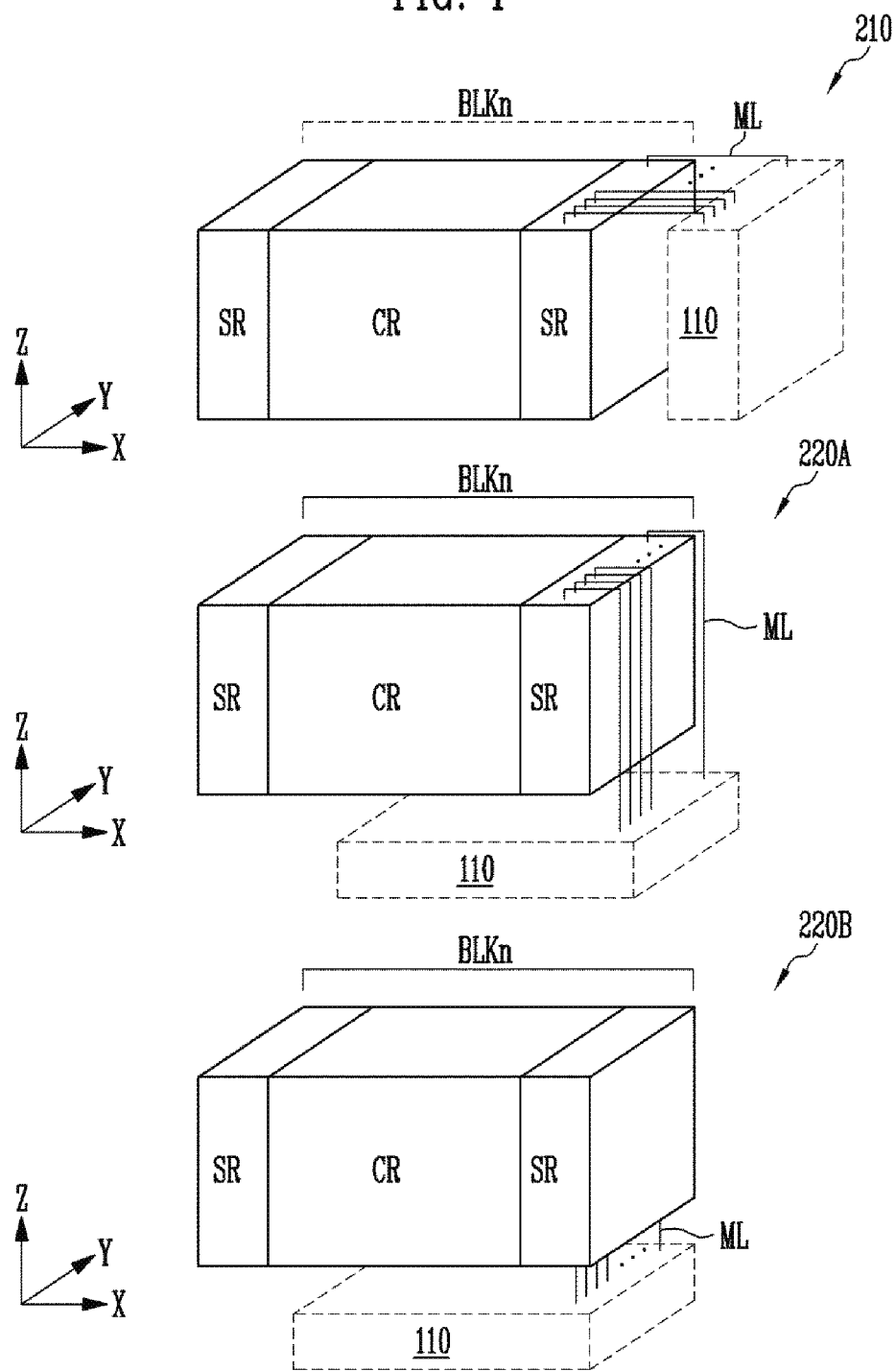
FIG. 4 is a view illustrating a configuration of a memory block and a connection relationship between the memory block and the peripheral circuits.

FIG. 4 is a view illustrating a configuration of a memory block BLKn and a connection relationship between the memory block BLKn and the peripheral circuits 110.

The plurality of memory blocks BLK1 to BLKn described in FIG. 3 may be configured identically to one another. For example, in FIG. 4, the memory block BLKn may represent any memory block among the plurality of memory blocks BLK1 to BLKn.

Referring to FIG. 4, the memory block BLKn formed in the three-dimensional structure may include a cell region CR in which memory cells are included and a slimming region SR for electrically connecting the peripheral circuits 110 and the cell region CR to each other. For example, a plurality of vertical strings in which memory cells and select transistors are stacked may be included in the cell region CR, and ends of a plurality of gate lines, which are connected to the memory cells and the select transistors, may be included in the slimming region SR. For example, in the slimming region SR, the gate lines may be stacked in a step structure in which a gate line located at a relatively lower portion extends longer than that located at a relatively upper portion. The gate lines exposed by the step structure may be connected to the peripheral circuits 110 through contact plugs.

When the peripheral circuits 110 and the memory block BLKn are disposed in parallel to each other (in the X direction) (210), a plurality of lines ML for electrically connecting the slimming region SR and the peripheral circuits 110 to each other may be formed. For example, in the structure 210, the plurality of lines ML may be disposed to extend along the X direction and to be spaced apart from each other along the Y direction.

When the peripheral circuits 110 are disposed under the memory block BLKn (in the Z direction) (220A), a plurality of lines ML for electrically connecting the slimming region SR and the peripheral circuits 110 to each other may be disposed to extend along the Z direction and to be spaced part from each other along the Y direction. As shown in the drawing, the plurality of lines ML extend above the slimming region SR (in the Z direction), extend horizontally (in the X direction) up to a region out of the slimming region SR, and then extend vertically in the lower direction (Z direction), to be connected the peripheral circuits 110 disposed under the memory block BLKn.

In another embodiment, when the peripheral circuits 110 are disposed under the memory block BLKn (in the Z direction) (220B), a plurality of lines ML for electrically connecting the slimming region SR and the peripheral circuits 110 to each other penetrate the slimming region SR and are connected to the peripheral circuits 110 disposed under the memory block BLKn.

In an embodiment of the present disclosure, a semiconductor memory device in which the plurality of lines ML penetrate the slimming region SR and are connected to the peripheral circuit 110 disposed under the memory block BLKn as shown in the structure 220B will be described.

Figure 5:
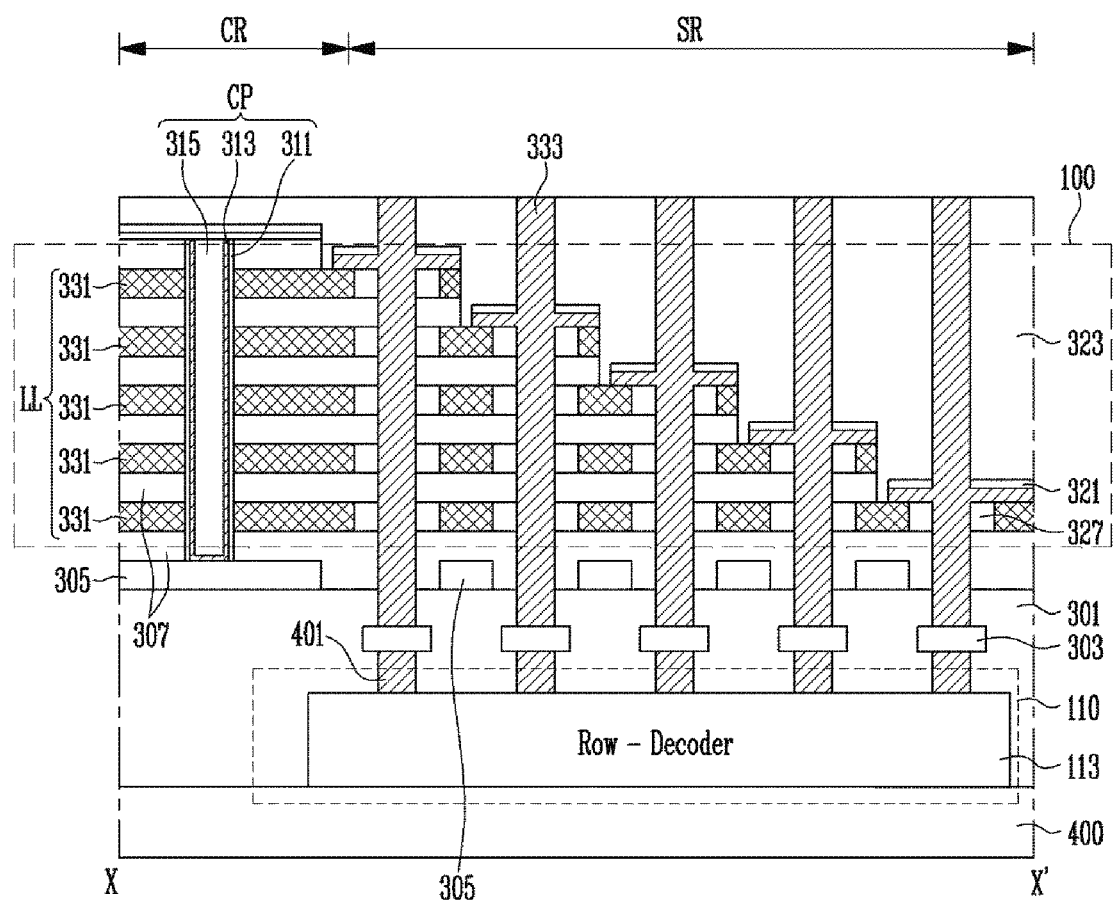
FIG. 5 is a sectional view of a semiconductor memory device, illustrating a cell region and a slimming region.

FIG. 5 is a sectional view of a semiconductor memory device, illustrating a cell region and a slimming region.

In FIG. 5, a case where peripheral circuits 110 are disposed under a memory cell array 100 including a plurality of memory cells, and a plurality of lines penetrate a slimming region SR of the memory cell array 100 and are connected to the peripheral circuits 110 as shown in the structure 220B described in FIG. 4 is illustrated as an embodiment.

Referring to FIG. 5, a cell region CR and the slimming region SR are disposed adjacent to each other in one direction X-X'.

The semiconductor memory device in accordance with an embodiment of the present disclosure may have a Peri Under Cell (PUC) structure. The peripheral circuits 110 may be provided under the memory cell array 100.

In an embodiment, the peripheral circuits 110 may include a row decoder 113. Although not shown in the drawing, the peripheral circuits 110 may further include at least one of the control logic 111, the voltage generator 112, the page buffer group 114, the column decoder 115, and the input/output circuit 116, which are shown in FIG. 1.

A semiconductor substrate 400 may be a single crystalline silicon substrate. The semiconductor substrate 400 may include a polysilicon substrate, a Silicon On Insulator (SOI) substrate, or a Germanium On Insulator (GeOI) substrate. The semiconductor substrate 400 may include Si, Ge, SiGe, etc.

A first interlayer insulating layer 301 covering the peripheral circuits 110 including the row decoder 113 may be provided on the semiconductor substrate 400. The first interlayer insulating layer 301 may include, for example, an insulating layer such as a silicon oxide layer. Metal lines 401 and 303 connected to the row decoder 113 may be provided in the first interlayer insulating layer 301.

An upper substrate 305 is stacked on the first interlayer insulating layer 301, and second interlayer insulating layers 307 and conductive layers 331 for local lines are alternately stacked on the upper substrate 305. The second interlayer insulating layer 307 is stacked on the uppermost conductive layer 331 for local lines.

The upper substrate 305 may include polycrystalline silicon. The upper substrate 305 may be generated using a method of forming a predetermined polycrystalline silicon region on the first interlayer insulating layer 301 and growing polycrystalline silicon by using the polycrystalline silicon region as a seed layer. The upper substrate 305 may be formed to be separated in a region in which a contact plug 333 connected to the row decoder 113 is formed in the slimming region SR.

The second interlayer insulating layer 307 may include an insulating material such as oxide, and the conductive layers 331 for local lines may include a conductive material such as polysilicon or tungsten.

A conductive layer stacked at the lowermost portion among the conductive layers 331 for local lines may be a source select line, a conductive layer stacked at the uppermost portion among the conductive layers 331 for local lines may be a drain select line, and the other conductive layers for local lines may be word lines.

A channel plug CP is disposed in the cell region CR of the memory cell array 100. The channel plug CP penetrates the second interlayer insulating layers 307 and the conductive layers 331 for local lines, and is formed vertically to the upper substrate 305. The channel plug CP includes a gap fill layer 315, a channel pattern 313 surrounding the gap fill layer 315, and a memory pattern 311 surrounding the channel pattern 313. For example, the memory pattern 311 may include at least one of a charge blocking layer, a data storage layer, and a tunnel insulating layer, and the data storage layer may include a floating gate such as silicon, a charge trap material such as nitride, a phase change material, nano dots, and the like. In addition, the channel pattern 313 may be formed in a shape completely filled in a central region, or be formed in a structure having an open central region. The gap fill layer 315 may be formed in the open central region.

The conductive layers 331 for local lines are disposed to extend from the cell region CR to the slimming region SR. The conductive layers 331 for local lines are stacked in the shape of steps in the slimming region SR. For example, the conductive layers 331 for local lines may be formed in a step structure in which a conductive layer 331 for local lines, which is disposed at a relatively lower portion, extends longer than that disposed at a relatively upper portion.

Each of the conductive layers 331 for local lines is electrically connected to any one of a plurality of contact plugs 333 which vertically penetrate the conductive layer 331 for local lines and the second interlayer insulating layers 307 and are connected to the lower metal line 303. Each of the plurality of contact plugs 333 has a protrusion part protruding in a horizontal direction, and a lower surface of the protrusion part is in contact with an upper surface of an end portion of any one of the conductive layers 331 for local lines. For example, each of the contact plugs 333 penetrates an end portion of a corresponding conductive layer 331 for local lines and extends in a vertical direction, and includes a protrusion part in electrical and physical contact with an upper surface of the end portion of the corresponding conductive layer 331 for local lines. Also, each of the contact plugs 333 may penetrate conductive layers 331 for local lines, which are disposed under a corresponding conductive layer 331 for local lines. A insulating layer 327 for spacers is formed in regions in which the contact plugs 333 and the conductive layers 331 for local lines intersect each other, i.e., on sidewalls of the contact plugs 333 penetrating the conductive layers 331 for local lines. The insulating layer 327 for spacers prevents each of the contact plugs 333 from being electrically connected to the other conductive layers 331 for local lines except a corresponding conductive layer 331 for local lines. The insulating layer 327 for spacers may be configured in a shape surrounding the sidewalls of the contact plugs 333 in the regions in which the contact plugs 333 and the conductive layers 331 for local lines intersect each other. Each of the contact plugs 333 is connected to a conductive layer 331 for local lines, which is disposed at the uppermost portion, among the conductive layers 331 for local lines, which are penetrated thereby, through the protrusion part.

Additionally, a pad layer 321 may be formed on the top of the protrusion parts of the contact plugs 333, and a third interlayer insulating layer 323 may be formed in a space between an upper portion of the cell region CR and the contact plugs 333 of the slimming region SR.

FIGS. 6 to 15 are views illustrating a manufacturing method of a semiconductor memory device in accordance with an embodiment of the present disclosure.

The manufacturing method of the semiconductor memory device in accordance with an embodiment of the present disclosure will be described as follows with reference to FIGS. 6 to 15.

In an embodiment of the present disclosure, processes after peripheral circuits 110 including a row decoder 113 are formed on a semiconductor substrate, and a lower metal line 303 connected to the row decoder 113 is formed in a first interlayer insulating layer 301 will be described.

Figure 6:
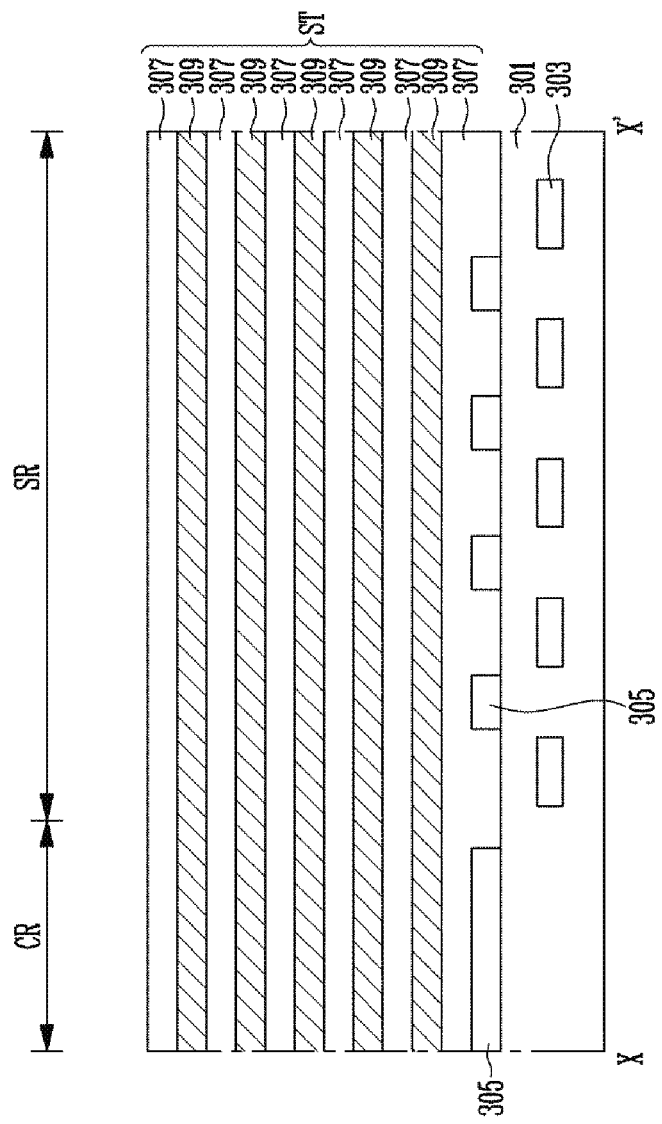
FIGS. 6 to 15 are views illustrating a manufacturing method of a semiconductor memory device in accordance with an embodiment of the present disclosure.

Referring to FIG. 6, an upper substrate 305 is formed on the first interlayer insulating layer 301 including a lower metal line 303. The upper substrate 305 may include a source line layer, and the source line layer may be a doped semiconductor layer. For example, the source line layer may be a semiconductor layer doped with an n-type impurity. In an embodiment, the source line layer may be formed by injecting an impurity into a surface of the upper substrate 305, or be formed by depositing at least one doped silicon layer on the upper substrate 305. In an embodiment, the source line layer may be formed by forming the first interlayer insulating layer 301 on the peripheral circuits 110 shown in FIG. 5 and then depositing at least one doped silicon layer on the first interlayer insulating layer 301.

In addition, the upper substrate 305 may be formed in a shape in which a region in which the lower metal line 303 is formed in the slimming region SR is open.

Subsequently, a stack structure ST in which first material layers 307 and second material layers 309 are alternately stacked is formed on a cell region CR and the slimming region SR. The second material layers 309 may be sacrificial layers for forming conductive layers such as a word line, a select line, and a pad, and the first material layers 307 may be second interlayer insulating layers for insulating the stacked conductive layers from each other.

The first material layers 307 are formed of a material having an etching rate higher than that of the second material layers 309. In an example, the first material layers 307 may include an insulating material such as oxide, and the second material layers 309 may include a sacrificial material such as nitride.

Figure 7:
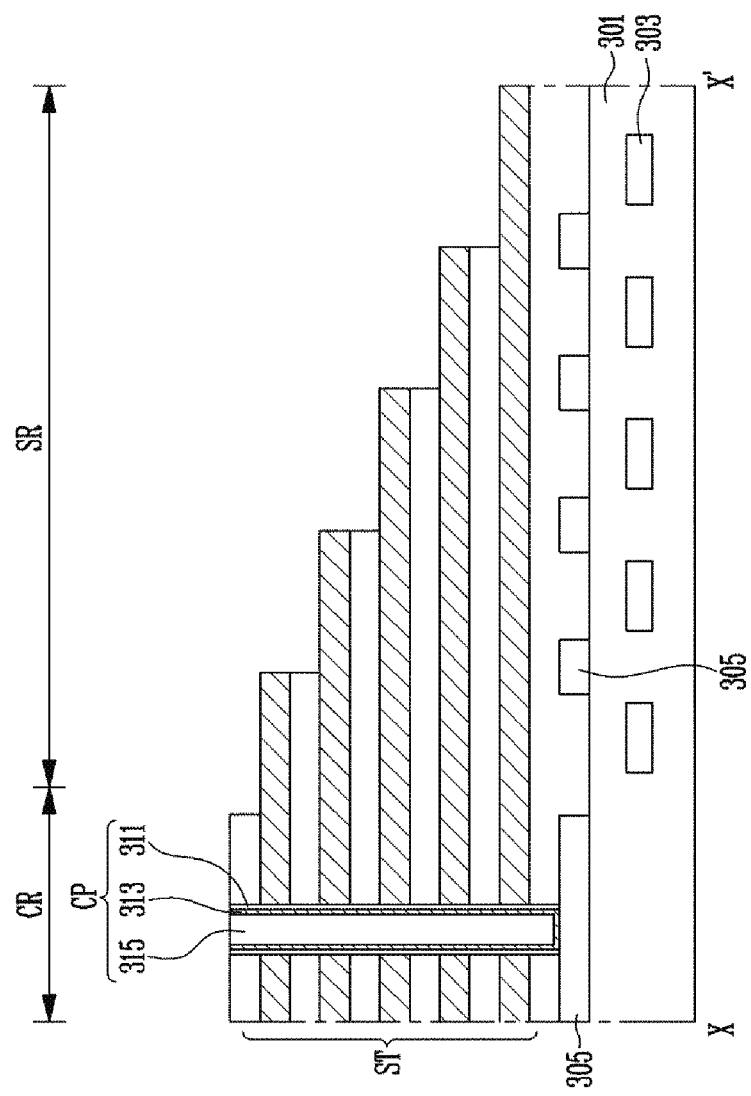

Referring to FIG. 7, a channel hole in which a channel plug CP is to be formed in the cell region is formed by etching the stack structure ST formed on the cell region CR. Subsequently, the channel plug CP including a channel pattern 313 and a memory pattern 311 surrounding the channel pattern 313 is formed in the channel hole. For example, the memory pattern 311 is formed on a sidewall of the channel hole. The memory pattern 311 may include at least one of a charge blocking layer, a data storage layer, and a tunnel insulating layer, and the data storage layer may include a floating gate such as silicon, a charge trap material such as nitride, a phase change material, nano dots, and the like. Subsequently, the channel plug CP is formed by completely filling a central region of the channel hole with the channel pattern 313. In another embodiment, the channel pattern 313 may be formed in a structure in which the central region of the channel hole is open, and a gap fill layer 315 may be formed in the open central region.

Subsequently, an etching process is performed such that the stack structure ST formed on the slimming region SR has a step shape. For example, in the slimming region SR, the first material layers and the second material layers of the stack structure ST may be formed in the shape of steps extending longer as becoming closer to the bottom thereof. For example, the stack structure ST may be formed in a step structure in which the second material layers exposed upward in the slimming region SR.

Figure 8:
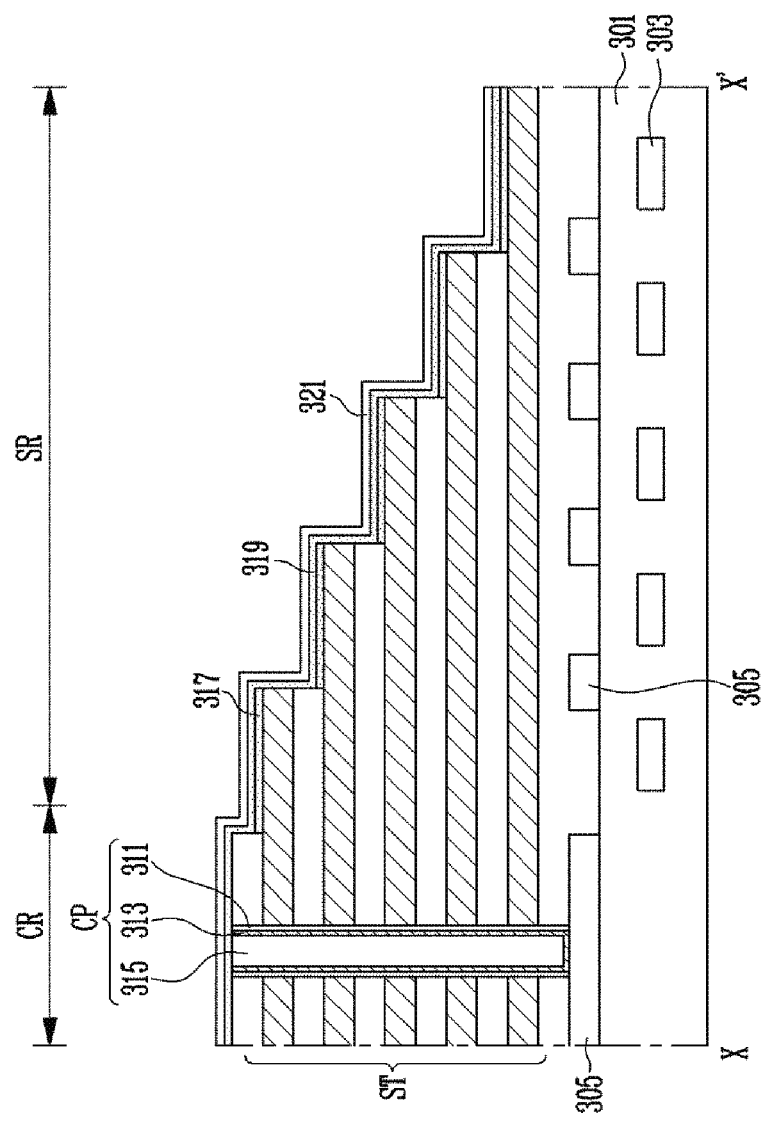

Referring to FIG. 8, sacrificial layers 317 and 319 and a pad layer 321 are formed on the entire structure including the cell region CR and the slimming region SR.

The sacrificial layers 317 and 319 may be formed to include a first sacrificial layer 317 and a second sacrificial layer 319. The first sacrificial layer 317 may be formed on the top of the exposed second material layers. In an example, the first sacrificial layer 317 may be formed of an oxide layer formed using an oxidation process. The second sacrificial layer 319 may be formed along an upper surface of the entire structure including the first sacrificial layer 317. In an example, the second sacrificial layer 310 may be formed of an undoped polysilicon layer.

The pad layer 321 may be formed along an upper surface of the entire structure including the sacrificial layers 317 and 319. In an example, the pad layer 321 may be formed of an oxide layer. In an example, a thickness of the pad layer 321 formed on the top of the stack structure ST may be thicker than that of the pad layer 321 formed on a sidewall of the stack structure ST.

Figure 9:
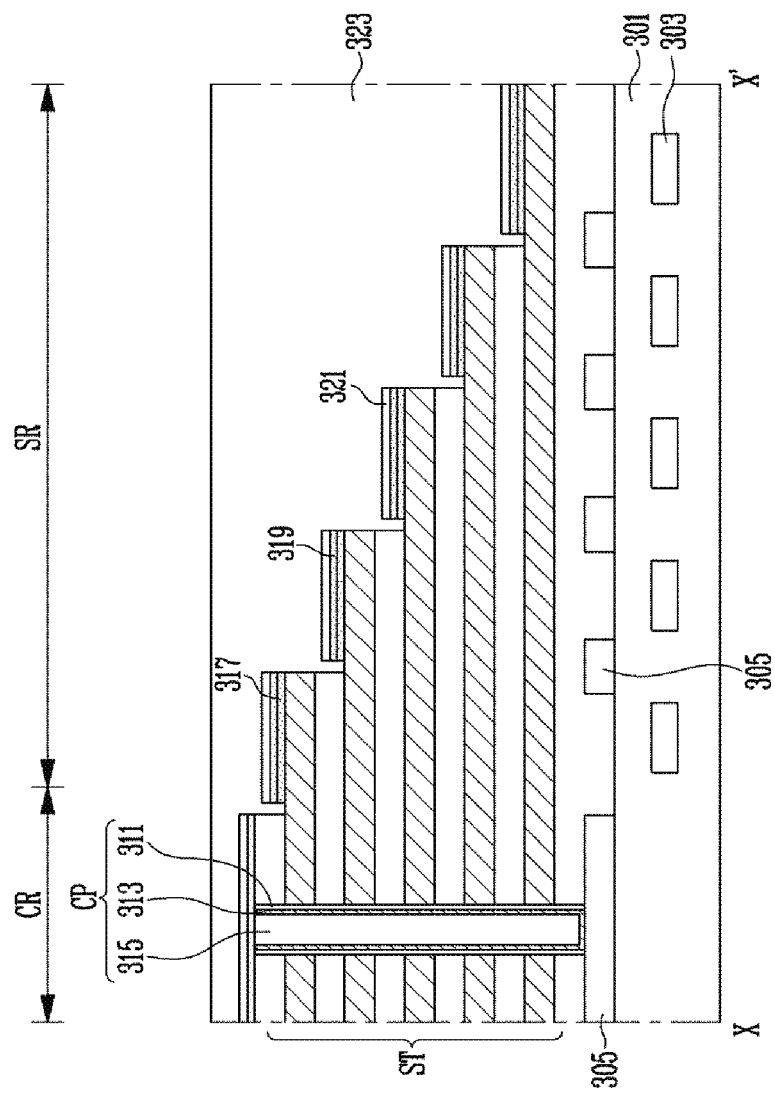

Referring to FIG. 9, the sacrificial layers 317 and 319 and the pad layer 321, which are formed on the sidewall of the stack structure ST, are removed by performing an etching process. For example, the etching process of the pad layer 321 may be performed using a wet etching process. Because the pad layer 321 formed on the sidewall of the stack structure ST is thinner than the pad layer 321 formed on the top of the stack structure ST in the wet etching process, the pad layer 321 formed on the sidewall of the stack structure ST may be removed in a state in which the pad layer 321 remains on the top of the stack structure ST. Subsequently, the sacrificial layers 317 and 319 exposed as the pad layer 321 is removed are removed by performing a dry etching process. That is, the sacrificial layers 317 and 319 formed on the sidewall of the stack structure ST are removed. Therefore, the sacrificial layers 317 and 319 and the pad layer 321 remain on only the top of the second material layers in the slimming region SR.

Figure 10:
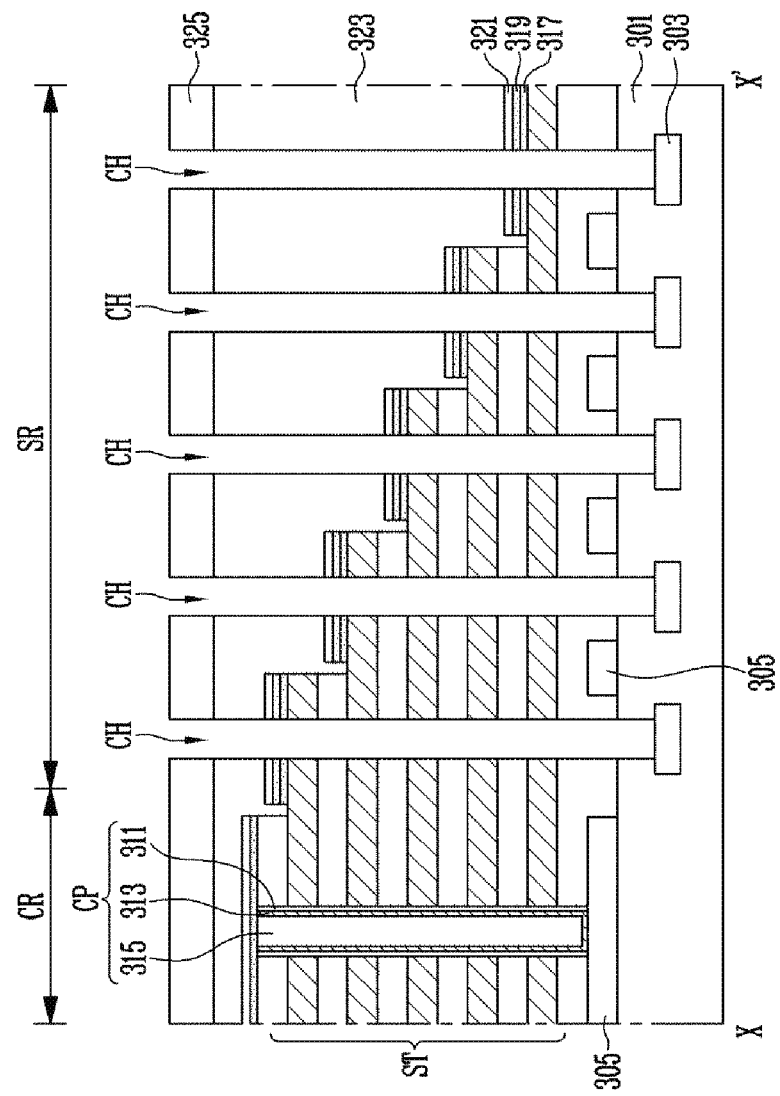

Referring to FIG. 10, a third interlayer insulating layer 323 is formed on the top of the entire structure including the cell region CR and the slimming region SR. The third interlayer insulating layer 323 may be formed of an oxide layer. Subsequently, a hard mask pattern 325 is formed on the top of the third interlayer insulating layer 323. The hard mask pattern 325 may be formed such that a region in which a contact hole is formed is open.

Subsequently, contact holes CH which penetrate the third interlayer insulating layer 323, the pad layer 321, the sacrificial layers 319 and 317, the stack structure ST, and the first interlayer insulating layer 301 and allows the lower metal line 303 to be exposed therethrough are formed by performing an etching process using the hard mask pattern 325.

Figure 11:
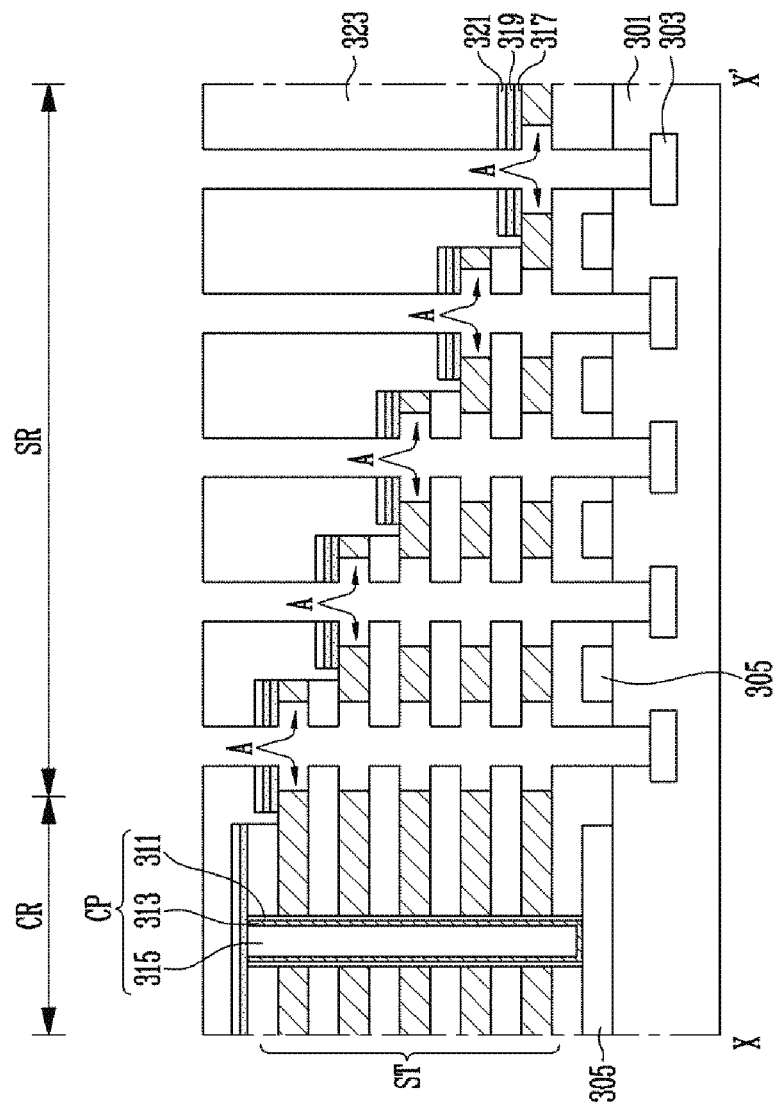

Referring to FIG. 11, the hard mask pattern 325 is removed, and the second material layers exposed through sidewalls of the contact holes are etched to a partial thickness, thereby forming a concave portion A at the sidewall of each of the contact holes. The partial thickness to which the second materials are etched may be thinner than a horizontal width of the sacrificial layers 317 and 319. For example, portions of end portions of the second material layers overlap with the sacrificial layers 317 and 319. For example, the partial thickness to which the second material layers are etched may be 50 nm to 100 nm.

Figure 12:
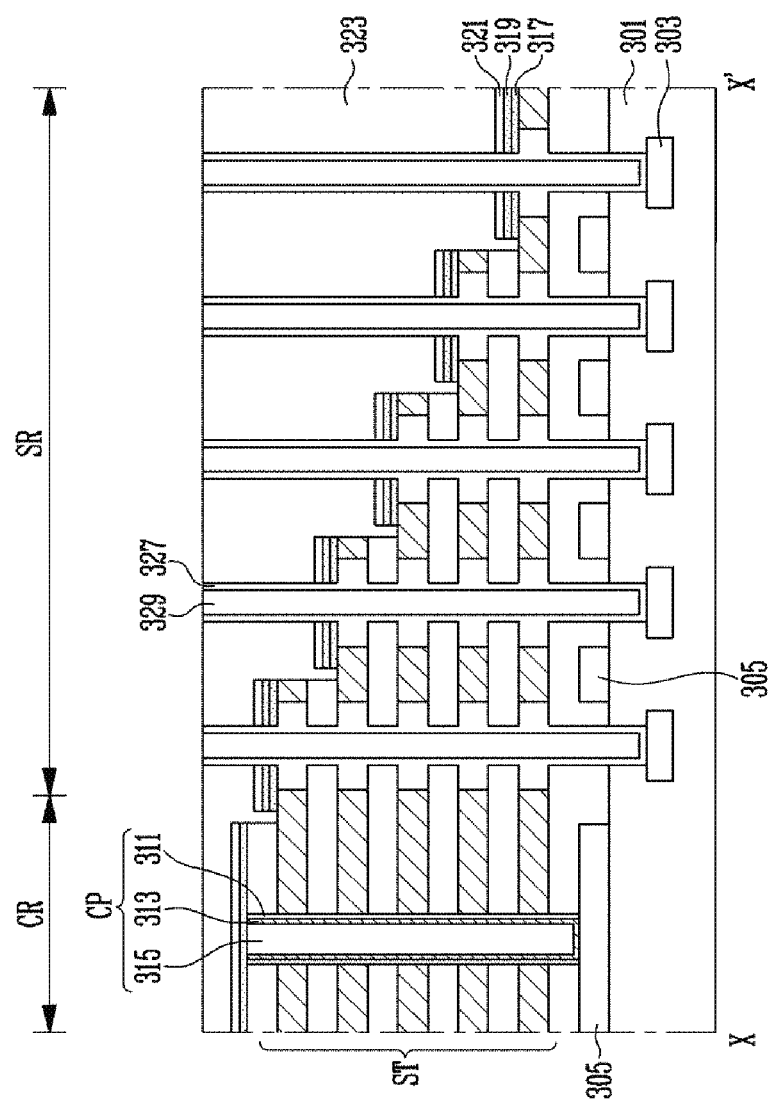

Referring to FIG. 12, an insulating layer 327 for spacers is formed on the sidewall of the contact hole. The insulating layer 327 for spacers may be formed to be embedded in the concave portion formed on the sidewall of the contact hole. Subsequently, the contact hole may be gap-filled with a polysilicon layer 329 for support forming.

Figure 13:
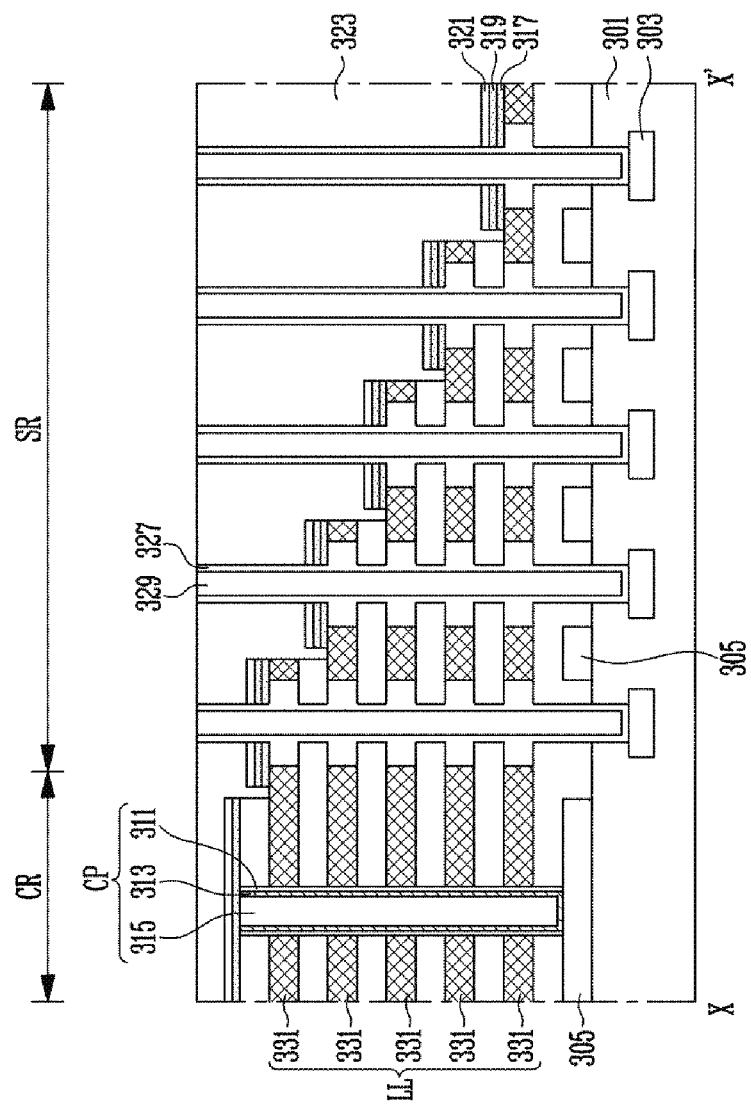

Referring to FIG. 13, at least one slit (not shown) penetrating the third interlayer insulating layer 323 and the stack structure ST is formed in the cell region CR and the slimming region SR, and a sidewall of the stack structure ST is exposed through the slit. Subsequently, the second material layers exposed through the slit are removed, and conductive layers 331 for local lines are formed in regions in which the second material layers are removed. The conductive layers 331 for local lines may be used as the local lines LL shown in FIG. 1.

Figure 14:
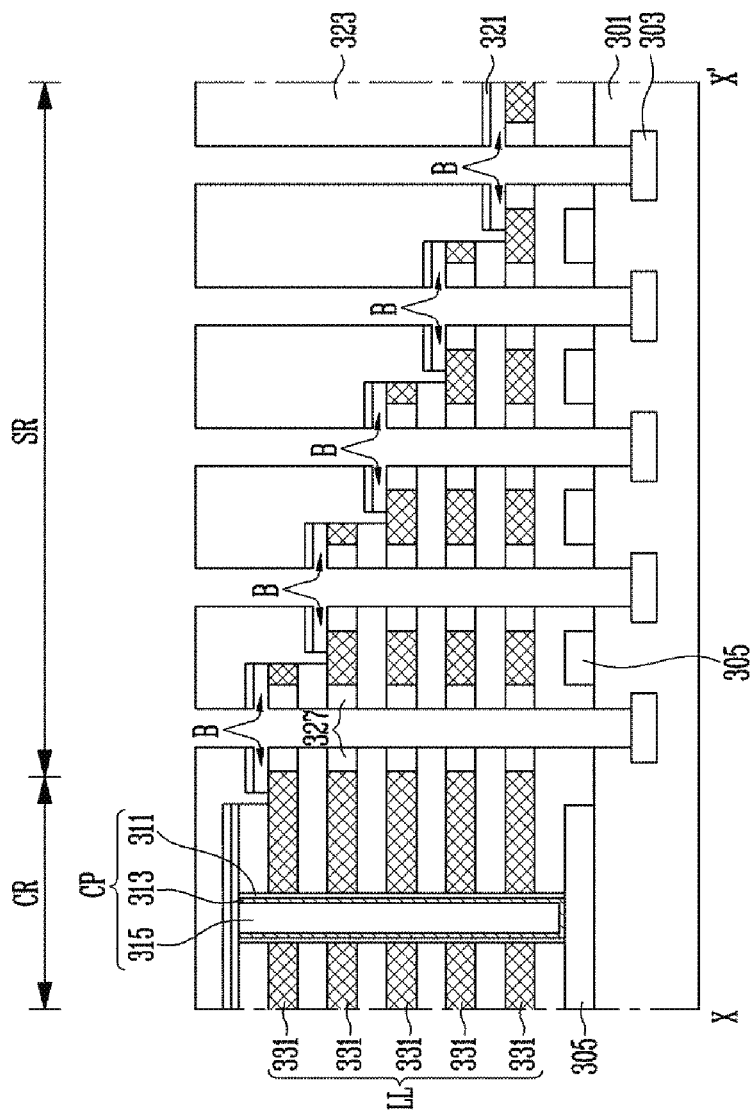

Referring to FIG. 14, sidewalls of the sacrificial layers (317 and 319 shown in FIG. 13) are exposed by removing the polysilicon layer for support forming, which is formed in the contact hole, and etching, to a partial thickness, the insulating layer 327 for spacers, which is formed on the sidewall of the contact hole. The insulating layer 327 for spacers remains in the concave portion at the sidewall of the contact hole, to prevent the conductive layers 331 for local lines from being exposed through the contact hole.

Subsequently, the exposed sacrificial layers are removed by performing an etching process. An upper surface of an end of each of the conductive layers 331 for local lines is exposed through a space B in which the sacrificial layers are removed.

Figure 15:
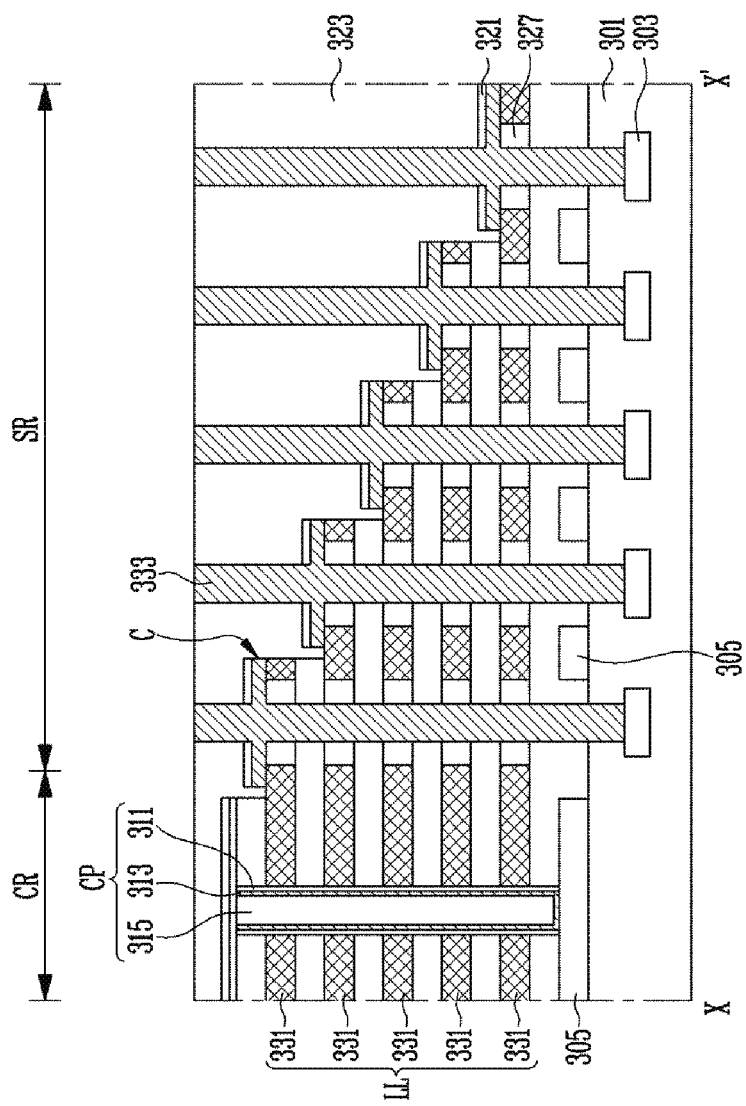

Referring to FIG. 15, contact plugs 333 are formed by filling the contact holes with a conductive material. Each of the contact plugs 333 is electrically connected to a corresponding lower metal line 303 on the bottom thereof. Each of the contact plugs 333 is formed to have a protrusion part C in a region in which the sacrificial layers are removed. A lower surface of the protrusion part C is electrically connected to a corresponding conductive layer 331 for local lines.

Figure 16:
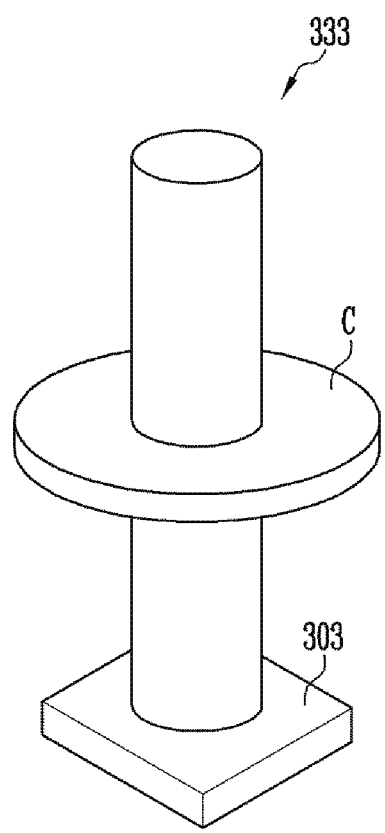
FIG. 16 is a three-dimensional view illustrating a contact plug shown in FIG. 15.

FIG. 16 is a three-dimensional view illustrating the contact plug shown in FIG. 15.

The contact plug 333 is formed in a cylindrical shape extending in a vertical direction of a substrate, so that a lower surface of the contact plug 333 is electrically connected to the lower metal line 303 while being in contact with the lower metal line 303. Also, a portion of the sidewall of the contact plug 333 may include the protrusion part C protruding in a horizontal direction of the substrate, and the protrusion part C may be provided in a disk shape. A portion of the lower surface of the protrusion part C is electrically connected to a corresponding conductive layer (331 shown in FIG. 15) for local lines while being in contact with the corresponding conductive layer for local lines.

Figure 17:
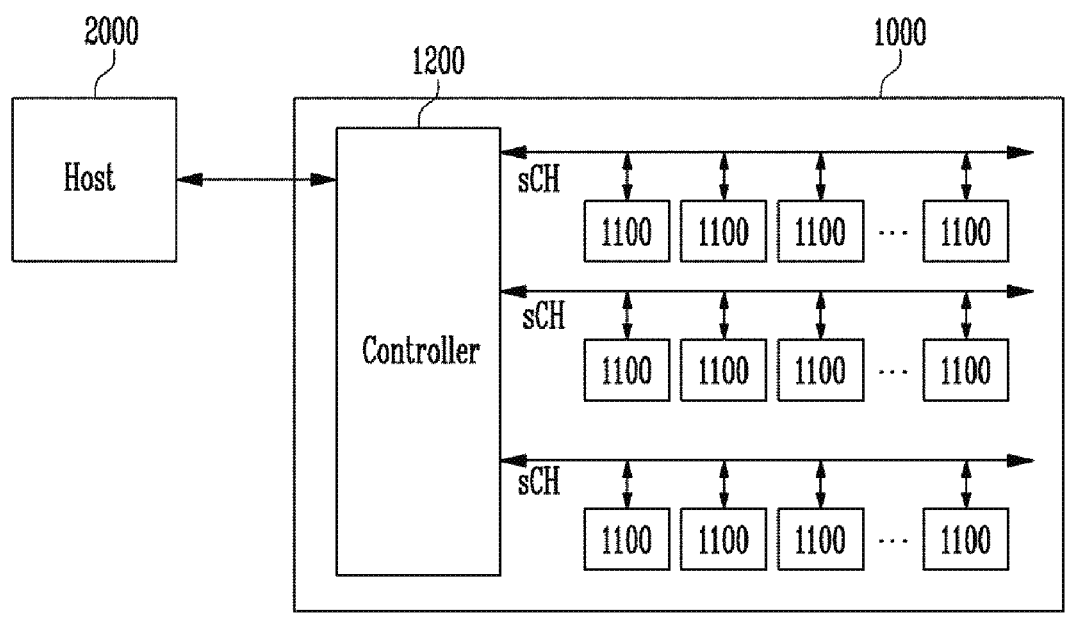
FIG. 17 is a diagram illustrating an embodiment of a memory system including the semiconductor memory device shown in FIG. 1.

FIG. 17 is a diagram illustrating an embodiment of a memory system 1000 including the semiconductor memory device 1100 shown in FIG. 1.

Referring to FIG. 17, the memory system 1000 may include a plurality of semiconductor memory devices 1100 configured to store data and a controller 1200 configured to communicate between the semiconductor memory devices 1100 and a host 2000.

Each of the semiconductor memory devices 1100 may be the semiconductor memory device described in the above-described embodiment.

The semiconductor memory devices 1100 may be connected to the controller 1200 through a plurality of system channels sCH. For example, a plurality of semiconductor memory devices 1100 may be connected to one system channel sCH, and the plurality of system channels sCH may be connected to the controller 1200.

The controller 1200 may communicate between the host 2000 and the semiconductor memory devices 1100. The controller 1200 may control the semiconductor memory devices 1100 in response to a request from the host 2000, or perform a background operation for improving performance of the memory system 1000 even when there is no request from the host 2000.

The host 2000 may generate requests for various operations, and output the generated requests to the memory system 1000. For example, the requests may include a program request capable of controlling a program operation, a read request capable of controlling a read operation, an erase request capable of controlling an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

Figure 18:
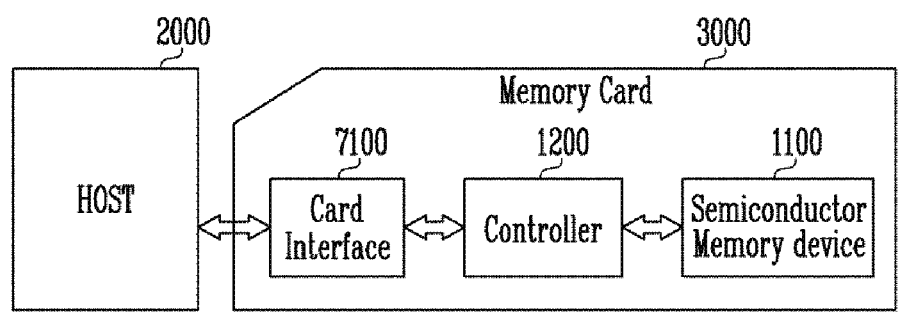
FIG. 18 is a diagram illustrating another embodiment of the memory system including the semiconductor memory device shown in FIG. 1.

FIG. 18 is a diagram illustrating another embodiment of a memory system including the semiconductor memory device 1100 shown in FIG. 1.

Referring to FIG. 18, the memory system may be implemented with a memory card 3000. The memory card 3000 may include a semiconductor memory device 1100, a controller 1200, and a card interface 7100.

The controller 1200 may control data exchange between the semiconductor memory device 1100 and the card interface 7100. In some embodiments, the card interface 7100 may be a Secure Digital (SD) card interface or a Multi-Media Card (MMC) interface, but the present disclosure is not limited thereto.

The card interface 7100 may interface data exchange between a host 2000 and the controller 1200 according to a protocol of the host 2000. In some embodiments, the card interface 7100 may support a Universal Serial Bus (USB) protocol and an Inter-Chip (IC)-USB protocol. The card interface 7100 may mean hardware capable of supporting a protocol used by the host 2000, software embedded in the hardware, or a signal transmission scheme.

When the memory card 3000 is connected to a host interface of the host 2000 such as a PC, a tablet PC, a digital camera, a digital audio player, a cellular phone, console video game hardware, or a digital set-top box, the host interface may perform data communication with the semiconductor memory device 1100 through the card interface 7100 and the controller 1200 under the control of a microprocessor of the host 2000.

In accordance with the present disclosure, a forming process of contact plugs connecting local lines of the semiconductor memory device to peripheral circuits can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory device comprising:
    a stacked structure including a plurality of conductive layers for local lines stacked on a semiconductor substrate defined by a cell region and a slimming region to be spaced apart from each other, wherein the plurality of conductive layers for local lines are stacked in a step structure in the slimming region;
    a plurality of contact plugs formed to penetrate the stack structure in the slimming region, one of the plurality of contact plugs corresponding to each of the conductive layers for local lines; and
    a pad layer formed on each of protrusion parts of the plurality of contact plugs,
    wherein each of the plurality of contact plugs includes a protrusion part protruding horizontally, and the protrusion part is connected to a corresponding conductive layer for local lines among the plurality of conductive layers for local lines.

2. The semiconductor memory device of claim 1, wherein the protrusion part of each of the plurality of contact plugs extends and protrudes to an end portion of the corresponding conductive layer for local lines.

3. The semiconductor memory device of claim 2, wherein the protrusion part of each of the plurality of contact plugs is connected to an upper surface of the end portion of the corresponding conductive layer for local lines.

4. The semiconductor memory device of claim 2, wherein a lower surface of the protrusion part of each of the plurality of contact plugs is connected to an upper surface of the end portion of the corresponding conductive layer for local lines.

5. The semiconductor memory device of claim 2, wherein each of the plurality of contact plugs corresponds to a conductive layer for local lines, which is disposed at the uppermost portion, among the plurality of conductive layers for local lines penetrated by the contact plug,
    wherein the protrusion part of each of the plurality of contact plugs is connected to the conductive layer for local lines, which is disposed at the uppermost portion.

6. The semiconductor memory device of claim 1, further comprising insulating layers for spacers, which are formed on sidewalls of the plurality of contact plugs in regions in which the plurality of contact plugs and the plurality of conductive layers for local lines intersect each other.

7. The semiconductor memory device of claim 6, wherein the insulating layers for spacers separate the sidewalls of the plurality of contact plugs from the plurality of conductive layers for local lines.

8. The semiconductor memory device of claim 1, further comprising a peripheral circuit structure disposed under the stack structure,
    wherein the plurality of contact plugs are connected to a plurality of metal lines connected to the peripheral circuit structure.

9. The semiconductor memory device of claim 8, wherein the peripheral circuit structure comprises a row decoder.

10. A semiconductor memory device comprising:
    a peripheral circuit structure formed on a semiconductor substrate;
    a memory cell array formed above the peripheral circuit structure;
    a plurality of contact plugs penetrating a slimming region of the memory cell array, the plurality of contact plugs being connected to a plurality of metal lines of the peripheral circuit structure; and
    pad layers surrounding sidewalls of the plurality of contact plugs, respectively,
    wherein, the memory cell array includes a plurality of conductive layers for local lines, which are stacked in a step structure in the slimming region,
    wherein each of the plurality of contact plugs includes a protrusion part protruding horizontally, and the protrusion part is connected to a corresponding conductive layer for local lines among the plurality of conductive layers for local lines, wherein the protrusion part is formed between one of the pad layers corresponding to the protrusion part and one of the conductive layers for local lines corresponding to the protrusion part.

11. The semiconductor memory device of claim 10, wherein the protrusion part of each of the plurality of contact plugs extends and protrudes to an end portion of the corresponding conductive layer for local lines.

12. The semiconductor memory device of claim 11, wherein a lower surface of the protrusion part of each of the plurality of contact plugs is connected to an upper surface of the end portion of the corresponding conductive layer for local lines.

13. The semiconductor memory device of claim 10, further including insulating layers for spacers, which are formed on sidewalls of the plurality of contact plugs in regions in which the plurality of contact plugs and the plurality of conductive layers for local lines intersect each other.

14. The semiconductor memory device of claim 10, wherein the peripheral circuit structure comprises a row decoder, wherein the row decoder is connected to the plurality of conductive layers for local lines through the plurality of metal lines and the plurality of contact plugs.

* * * * *